United States Patent [19]

Watanabe et al.

[11] Patent Number: 5,173,864
[45] Date of Patent: Dec. 22, 1992

[54] STANDARD CELL AND STANDARD-CELL-TYPE INTEGRATED CIRCUIT

[75] Inventors: Hiroyuki Watanabe, Tokyo; Tsuneaki Kudou, Kawasaki, both of Japan

[73] Assignee: Kabushiki Kaisha Toshiba, Kawasaki, Japan

[21] Appl. No.: 722,379

[22] Filed: Jun. 26, 1991

Related U.S. Application Data

[63] Continuation of Ser. No. 395,107, Aug. 17, 1989, abandoned.

[30] Foreign Application Priority Data

Aug. 20, 1988 [JP] Japan .................................. 63-205688

[51] Int. Cl.$^5$ ............................................. G06F 15/20
[52] U.S. Cl. ..................................... 364/491; 371/22.3
[58] Field of Search ............... 364/488, 489, 490, 491; 371/22.3

[56] References Cited

U.S. PATENT DOCUMENTS

| | | | |
|---|---|---|---|
| 4,577,276 | 3/1986 | Dunlop et al. | 364/491 |
| 4,584,653 | 4/1986 | Chih et al. | 364/491 |
| 4,591,993 | 5/1986 | Griffin et al. | 364/491 |
| 4,613,940 | 9/1986 | Shenton et al. | 364/491 X |
| 4,694,403 | 9/1987 | Nomura | 364/488 |
| 4,698,760 | 10/1987 | Lembach et al. | 364/490 |
| 4,916,388 | 4/1990 | Sano | 371/22.3 X |
| 4,922,432 | 5/1990 | Kobayashi et al. | 364/488 X |
| 4,924,430 | 5/1990 | Zasio et al. | 364/488 X |
| 4,964,056 | 10/1990 | Bekki et al. | 364/488 |
| 4,972,324 | 11/1990 | Tanaka | 364/488 X |
| 5,023,875 | 6/1991 | Lee et al. | 371/22.3 X |

FOREIGN PATENT DOCUMENTS 0175880 4/1986 European Pat. Off. .
57-162835 10/1982 Japan .

OTHER PUBLICATIONS

Sanders et al.; "Philo-A VLSI Design System"; 19th Design Automation Conference, 1982, pp. 163-169.
P. J. Hicks, "Structure of semi-custom integrated circuits", Semi-Custom IC Design and VLSI, 1983, pp. 40-55.
Masakazu Shouji, CMOS Digital Circuit Technology, Computer Science Research Center, AT & T Bell Laboratories, NJ, 1988, pp. 287-291.
Seaton et al: "Built-In Testability Helps to Clear Some Stubborn IC bottlenecks", Electronic Design, vol. 34, No. 28, Nov. 27, 1986, pp. 101-104.
Scharfetter, "Polycell Place and Route Technique", Zerox Disclosure Journal, Jan.-Feb. 1984, vol. 9, No. 1, p. 83.
Martinez et al.: "Compilation of Standard-Cell Libraries", IEEE Journal of Solid-State Circuits, vol. SC-22, No. 2, Apr. 1987, pp. 190-197.
"Computers and Digital Electronics", Machine Design, May 19, 1988, pp. 12 and 25.

Primary Examiner—Parshotam S. Lall
Assistant Examiner—Edward R. Cosimano
Attorney, Agent, or Firm—Foley & Lardner

[57] ABSTRACT

A standard cell for standard-cell type integrated circuits, designed with a computer, includes a basic functional circuit, for example, a flip-flop circuit and a signal delay circuit connected to the basic functional circuit. The signal delay circuit is located within the standard cell along with the basic functional circuit. The design allows the timing of the integrated circuit to be adjusted without changing the geometry of the integrated circuit.

1 Claim, 8 Drawing Sheets

STANDARD CELL AND STANDARD-CELL-TYPE INTEGRATED CIRCUIT

This application is a continuation of application Ser. No. 07/395,107, filed Aug. 17, 1989, now abandoned.

BACKGROUND OF THE INVENTION

1. Field of the Invention

The present invention relates to a standard cell, a standard-cell-type integrated circuit which comprises a plurality of standard cells and a wiring method thereof, and more particularly to a standard cell having a delay function in addition to functions inherent thereto, a standard-cell-type integrated circuit produced with the standard cell, and a designing method for the standard-cell-type circuit.

2. Description of the Prior Art

Conventionally, there is known a standard cell system in which various cells having fundamental functions, such as AND gates, OR gates, flip-flops, and selectors are registered in a library as standard cells, and an integrated circuit is designed using them.

Arrangement of a plurality of the standard cells onto a chip and wiring among them are carried out using a computer as mentioned below.

As compared with a case in which a gate array system is used, a standard-cell-type integrated circuit which is designed and produced by this standard cell system can realize a high degree of freedom in design, reduction of chip area, a low production cost, various system functions on one chip, and the like.

On the other hand, it takes a relatively long time to develop the standard-cell-type integrated circuit as compared with the case of a gate array system.

In the standard-cell-type integrated circuit according to the conventional system, each standard cell (hereinafter called a cell) is arranged parallel in a row as shown in FIG. 6 and a width of the cell is determined by the cell. Therefore the width can not be changed.

In FIG. 6 each space between each adjacent pair of the cell rows is used for wiring therebetween. At an upper periphery, a lower periphery or an intermediate portion of each the cell is provided with an input-output terminal for each signal. A predetermined logic function is realized by connecting the respective terminals in the wiring area.

However, the conventional standard-cell-type integrated circuit causes the following problem.

Since the integrated circuit comprises a combination of a plurality of standard cells, a signal propagation delay occurs in each gate and each signal wire even though there is no error in the logic design itself. Therefore, the so-obtained integrated circuit may operate incorrectly.

Accordingly, a delay circuit should be suitably inserted in such a conventional integrated circuit for prevention of incorrect operation caused by signal propagation delay, thereby compensating for the delay and matching signal propagation.

FIG. 1 shows a portion of a shift register which is composed of a series connection of flip-flops 1 and 2. FIG. 2 shows a timing chart in a case in which the shift register shown in FIG. 1 is operated ideally. In practice, a propagation delay of a clock signal occurs, for example, in a clock wire 3 for transmitting a clock signal. FIG. 3 shows a timing chart at each terminal when the propagation delay of the clock signal occurs. The clock signals CK1 and CK2 should be inputted in the flip-flops 1 and 2 at the same time respectively. However, since the propagation delay occurs in the clock wire 3, the clock signal CK2 is inputted in the flip-flop 2 later than the clock signal CK1. Thus, incorrect wrong operation occurs.

In order to avoid the occurrence incorrect operation caused by the signal delay, a delay circuit 4 is inserted between an output terminal Q1 of the flip-flop 1 and an input terminal D2 of the flip-flop 2 as shown in FIG. 4. FIG. 5 is a timing chart to show an operation of the shift register shown in FIG. 4. When the register is composed as mentioned above, the propagation delay of the clock signal in the clock wire 3 can be compensated.

As a method of inserting the delay circuit into the integral circuit, there is known a method in which a cell having only a delay function is registered in a library, and then the cell is inserted in a predetermined location.

FIG. 6 shows a composition of a cell arrangement which realizes the circuit shown in FIG. 4 in accordance with the method mentioned above. A delay function standard cell 5 in the same drawing corresponds to the delay circuit 4 in FIG. 4. Standard cells 6 and 7 correspond to the flip-flops 1 and 2 respectively.

FIGS. 7 and 8 are circuit compositional diagrams of the standard cells 5 and 6 respectively. FIG. 7 illustrates a detailed circuit diagram for implementing a time delay using a resistor RR, a capacitor CC, and gates 71 and 72. FIG. 8 illustrates a detailed circuit diagram for implementing a flip-flop using gates 81 through 90.

In the design of the standard-cell-type integrated circuit, the arrangement of each standard cell on a real chip and the wiring among them are determined by using CAD (Computer Aided Design). When CAD is used, labor is reduced.

In order to facilitate a function test which is conducted after the design of the integrated circuit, a test circuit having a predetermined function is added in the integrated circuit. There are various compositional methods and testing methods for a test-facilitated integrated circuit. For example, the methods include the serial scan method and the LSSD (Level Sensitive Scan Design) method.

However, the above-mentioned methods cause the following problem.

A delay function is registered in a library as a cell, and then automatic placement and routing is carried out using a computer. The so-obtained layout presents a mode, for example, as shown in FIG. 6. In this case, the wiring length from the flip-flop cell 6 to the flip-flop cell 7 through the delay cell 5 depends on the position of the delay cell 5. However, the position of the delay cell 5 is not decided until automatic placement and routing of the cell is carried out. Accordingly, the degree of signal delay and the effect of the delay cell cannot be estimated because the wiring length is not decided before the automatic placement and routing.

Moreover, when delay compensation is not carried out correctly, for example, when a delay time owing to the delay cell is longer than estimated, the operation speed of the integrated circuit becomes lowered. Additionally, since the delay cell is provided anew, the chip area must be enlarged.

The problem which occurs during the function test of the test-facilitated integrated circuit, that is, the signal delay caused by gates and wires, occurs and incorrect operation results. Thus, a predetermined function test cannot be carried out in this case.

FIG. 9 is a partial view of a test-facilitated standard-cell-type integrated circuit based on the serial scan system. In the same drawing, reference numeral 8 and 9 denote flip-flop standard cells. Reference numeral 10 denotes a combinational logic circuit. The flip-flop standard cells 8 and 9 have terminals S1 and S2 for inputting scan signals during the function test respectively.

Output signals of the standard cell 8 are inputted into an input terminal D2 of the standard cell 9 through the logic circuit 10 (channel 8a), and directly into a scan signal input terminal S2 of the standard cell 9 (channel 8b).

The combination of the standard cells 8 and 9 composes a shift register. When the flip-flops are connected in the integrated circuit as shown in the drawing, the content and the state of each of the flip-flops (standard cells 8 and 9) can be read and written into an external portion at the time of the function test.

However, in the circuit shown in FIG. 9, some output signals are transmitted from the output terminal Q1 of the standard cell 8 to the input terminal S2 of the standard cell 9 without passing through the combinational logic circuit 10 during the test. Therefore, when a signal delay which occurs in the channel 8b from the output terminal Q1 to the input terminal S2 becomes shorter than another clock signal delay which occurs between the clock signal input terminal CK1 and the clock signal input terminal CK2, incorrect operation occurs. In this case, the function test cannot be carried out correctly.

Moreover, incorrect operation is also caused by the clock signal propagation delay between the cells 8 and 9 as mentioned above.

SUMMARY OF THE INVENTION

An object of the present invention is to eliminate the above-mentioned problems. Another object of the present invention is to provide a standard-cell-type integrated circuit and a designing method thereof which can further shorten the development term.

In order to achieve the objects, a standard cell of the present invention has circuit means (comprising, e.g., a capacitor and a resistor) having a predetermined function characteristic, and signal delay circuit means which is provided on the input side or the output side a standard cell of the circuit means and delays a signal inputted therein by a predetermined time.

The signal delay circuit means may be arranged under power source lines built in the standard cell. Moreover, the standard cell may be constructed so that it has the same cell width as a standard cell not having the signal delay circuit means, and optionally has the same terminal positions.

There may be employed a designing method using a computer which determines each location requiring a signal delay process based on each the wiring length calculated from a circuit diagram, and replaces a standard cell provided at each position by the standard cell according to the present invention.

There may be employed another designing method using a computer which effects simulation by a pattern obtained by an automatical determination of the arrangement of each standard cell and the wiring mode thereof and corresponding to a real integrated circuit, determines each location requiring a signal delay process based on operation of the real integrated circuit, and replaces a standard cell provided at each location with a standard cell according to the present invention.

According to the standard cell of the present invention having the above-mentioned composition, in the production of the standard-cell-type integrated circuit, compensation for the signal propagation delay can be effected more correctly than in the prior art, and the development term for the standard-cell-type integrated circuit is shortened.

When a standard cell having the delay function is constructed such that its cell width, and optionally, its terminal positions are the same as those of the standard cell not having the delay function, the development term for the standard-cell-type integrated circuit is further shortened as compared with the above-mentioned case.

These and other objects, features and advantages of the present invention will be more apparent from the following description of a preferred embodiment, taken in conjunction with the accompanying drawings.

DETAILED DESCRIPTION OF THE EMBODIMENTS

Hereinafter, embodiments of the present invention will be described with reference to the drawings.

Figure 10:
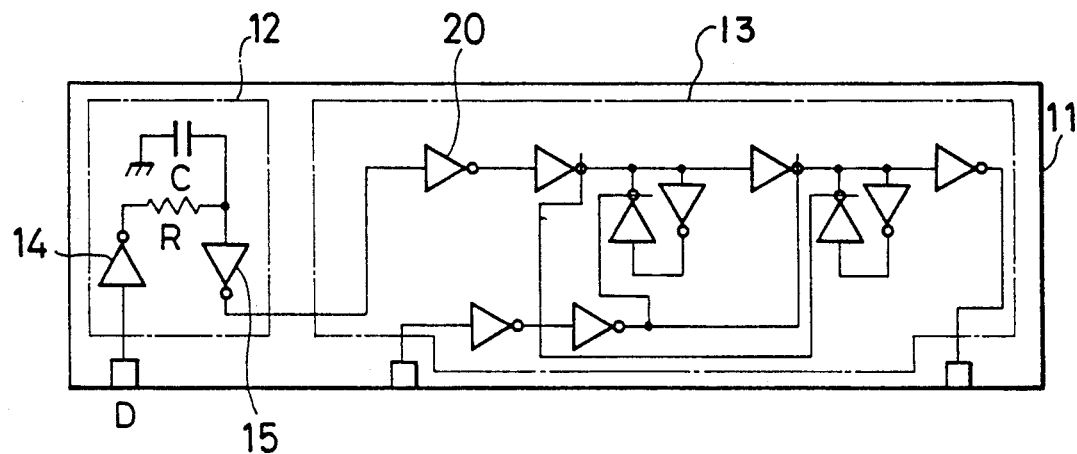
FIGS. 10 and 13 are respectively circuit diagrams of standard cells incorporating delay circuits of embodiments according to the present invention.

FIG. 10 shows a circuit diagram of a standard cell 11 of an embodiment of the present invention. In the diagram, the standard cell 11 (hereinafter called "cell 11") of the embodiment has a delay circuit 12 and a flip-flop circuit 13 which is a function inherent to the cell 11. The delay circuit 12 comprises a resistor R, a capacitor C, and two inverters 14, 15. Input into the delay circuit 12 is carried out from an external portion through an input terminal D of the cell 11. Output from the delay circuit 12 is supplied to the flip-flop circuit 13 which is provided in the cell 11. Accordingly, the delay circuit 12 delays a signal from the input terminal D by a time corresponding to the time constant CR of the delay circuit 12, and transmits the so-delayed signal into the flip-flop circuit 13.

Figure 1:
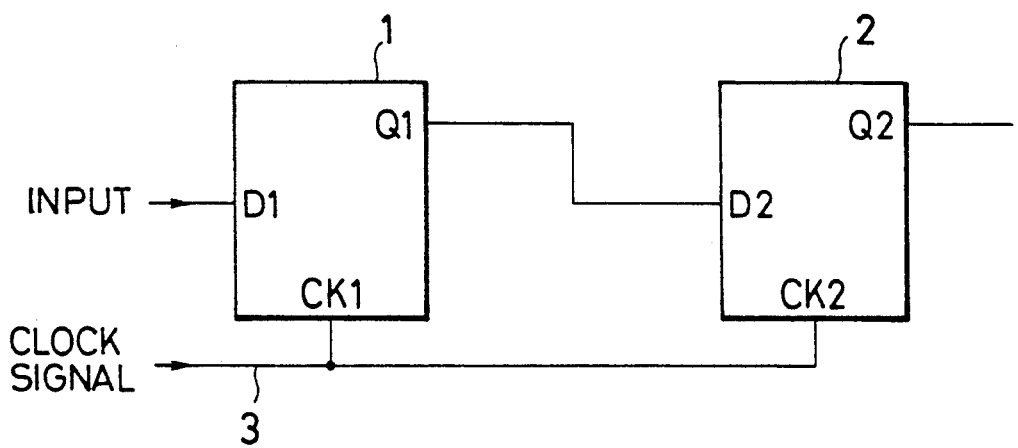
FIG. 1 is a partial circuit diagram of a shift register.
Figure 2:
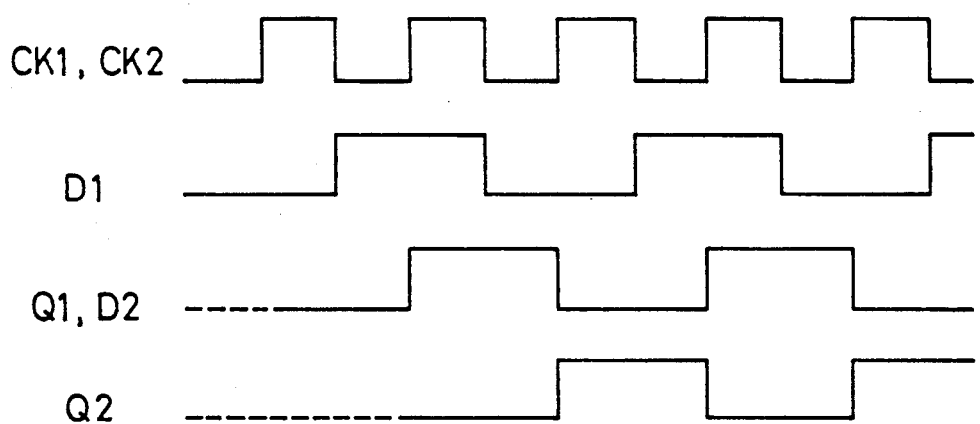
FIGS. 2 and 3 are timing charts to show operation of the circuit in FIG. 1.
Figure 3:
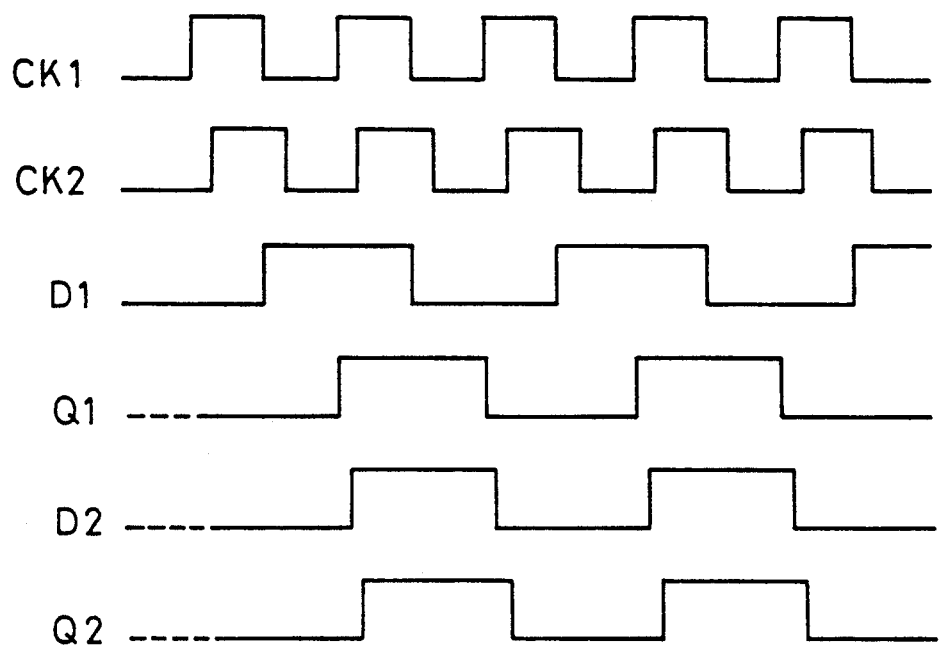
Figure 4:
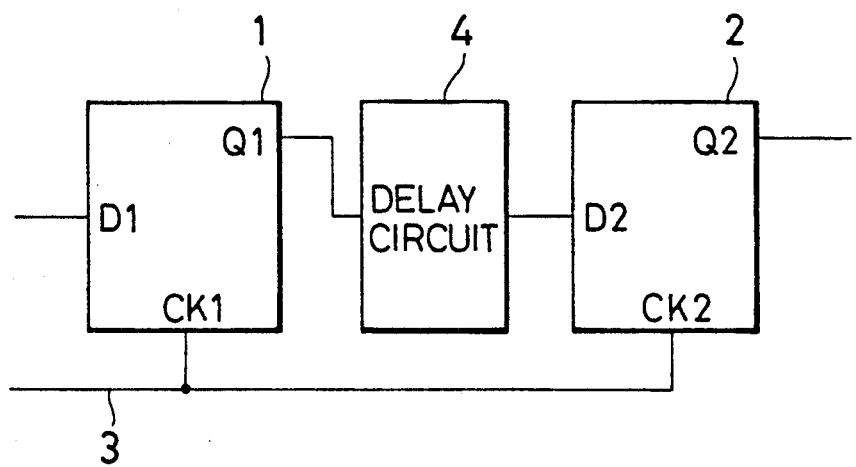
FIG. 4 is a circuit diagram of a shift register having a delay circuit.
Figure 5:
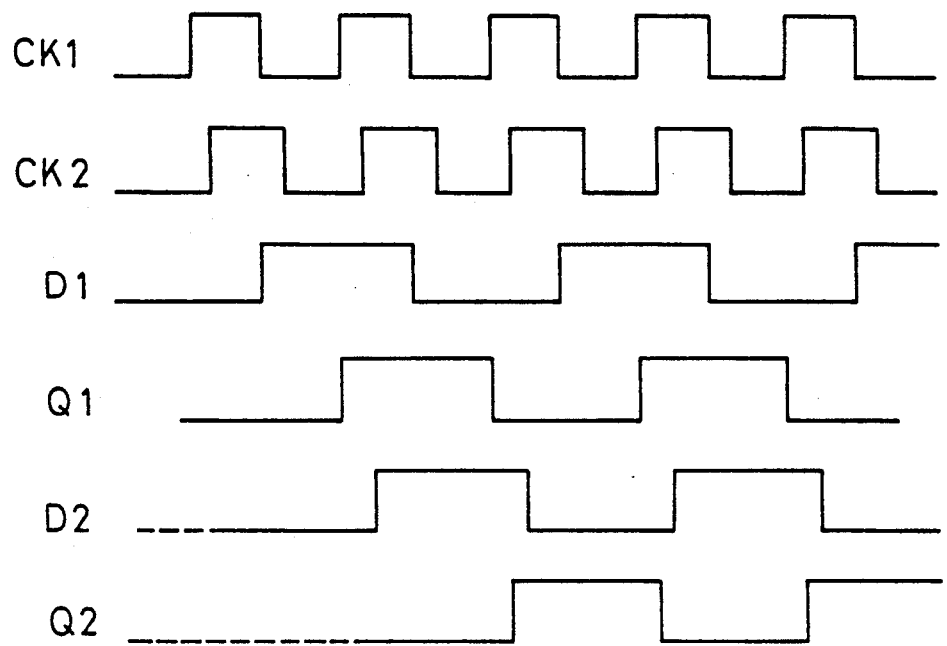
FIG. 5 is a timing chart to show operation of the circuit in FIG. 4.
Figure 6:
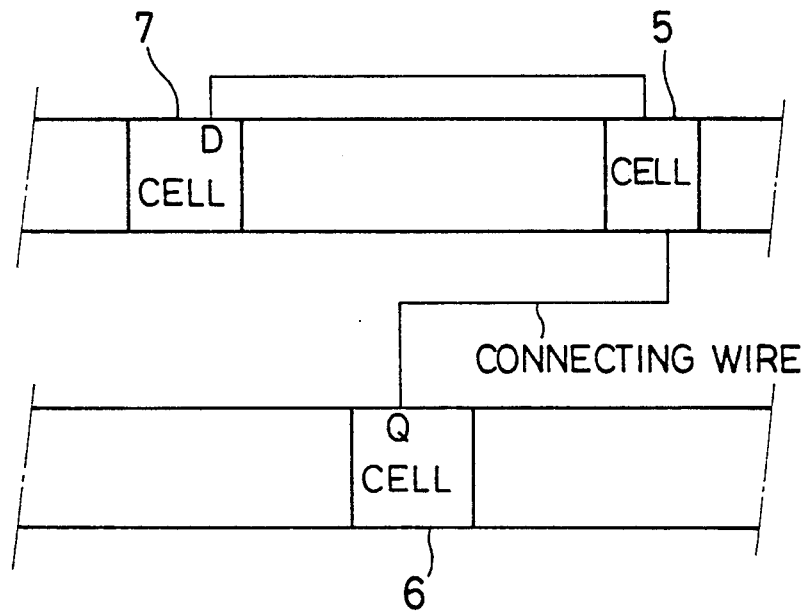
FIG. 6 is a cell arrangement of a standard-cell-type integrated circuit corresponding to the circuit in FIG. 4.
Figure 11:
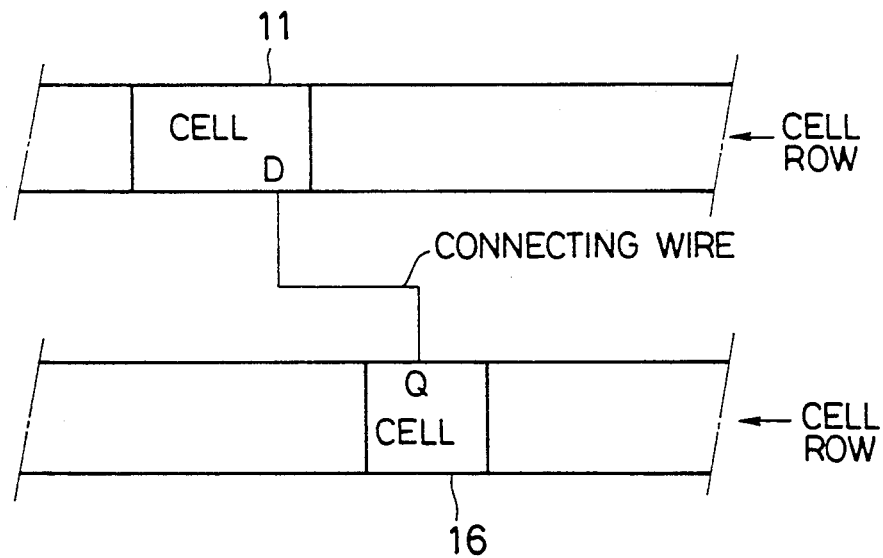
FIG. 11 is a diagram to show a cell arrangement of a standard-cell-type integrated circuit which is obtained with the standard cell of the embodiment in FIG. 10.

FIG. 11 shows an automatic placement and routing diagram in the case where a standard-cell-type integrated circuit is produced with the standard cell 11 which is the embodiment in FIG. 10. In the same diagram, a standard cell 16 disposed in the lower cell row corresponds to the flip-flop 1 in FIG. 4, while the standard cell 11 disposed in the upper cell row corresponds to the flip-flop 2 and the delay circuit 4 in FIG. 4. The wiring mode from the cell 16 to the cell 11 depends on a relative positional relation between the standard cells 16 and 11. Therefore, estimation of a temporary wiring length before the automatic placement and routing can be carried out correctly. Accordingly, a delay time in the wiring path can be correctly estimated. As a result, the delay in the wiring path can be compensated for easily and correctly, and the integral circuit can effect its predetermined function.

Hereinafter, a designing method for the standard-cell-type integrated circuit of the embodiment will be described in detail with reference to a flow chart shown in FIG. 12. First, a circuit diagram having a predetermined function is prepared (Process 121). In this process, a standard cell (FIG. 10) incorporating a delay circuit is designated in consideration of occurrence of a delay time in each gate.

Next, simulation for investigation of whether the circuit designed in Process 121 has the predetermined logic function is carried out (Process 122). In this simulation, delay time caused by each gate and wire is not considered.

As a result of the simulation, when it is recognized that the designed circuit has the predetermined logic function, another simulation is carried out considering the delay time caused by each gate and wire (Process 123). In this simulation, a temporary wiring length is used based on the circuit diagram.

As a result of the second simulation (Process 123), when it is recognized that new delay compensation is required, or that compensation is not required, delay adjustment is carried out by replacing a cell not having a delay circuit with the cell of the present invention having the delay circuit, or the reverse replacing (Process 125).

Thereafter, the simulation in Process 123 is carried out again on the replaced circuit, and the result of the simulation is judged again in Process 124. These Processes 123 and 124 are repeated until the desired result of the simulation can be satisfied, then a pattern for an integrated circuit is prepared (Process 126).

In the pattern preparation of Process 126, the arrangement of each cell and the wiring mode thereof is determined so that the chip area of the integrated circuit becomes minimum.

The so-prepared pattern in Process 126 is equivalent to a real integrated circuit.

Next, simulation of circuit operation is carried out based on the pattern prepared in Process 126 (Process 127).

In Process 127, simulation based on a real wiring length of the circuit is carried out.

As a result of the simulation, whether the circuit effects a predetermined function is judged (Branch 128). The simulation in Process 123 is based on a temporary wiring length. When it is judged that the circuit does not effect the predetermined function in Branch 128, delay adjustment is carried out again in Process 129. In the delay adjustment, replacement of a cell not having a delay circuit with another cell having it, or the reverse replacement is conducted. Usually, since both kinds of the cells differ in the cell width or in terminal positions, the circuit pattern which is already obtained in Process 125 cannot be used. Accordingly, the integrated circuit is fed back to Process 123. When the result of the simulation in Process 127 is satisfactory, preparation of a mask employed for photolithography is carried out in Process 1210.

Next, in Process 1211, a standard-cell-type integrated circuit chip is prepared using photolithography.

In the above embodiment, since a cell incorporating the delay circuit is used, the number of cells can be reduced as compared with the case in which a cell having a delay function is provided separately. Since the undecidability of the wiring length is smaller, the number of simulation can be reduced.

Namely, the case where the result obtained by the simulation in Process 123 based on the temporary wiring length and the result obtained by the simulation in Process 127 based on the real wiring length differ from each other is rare.

Moreover, since the number of cell-terminals can be reduced as compared with the case in which another cell having a delay function is provided separately as in the prior art, the chip area of the integrated circuit can be reduced.

Additionally, the standard cell employed in the present invention and incorporating the delay circuit is not limited to the structure shown in FIG. 10, and for example, the delay circuit may be incorporated on the output side of the cell, or on both the input and output sides thereof.

Figure 13:
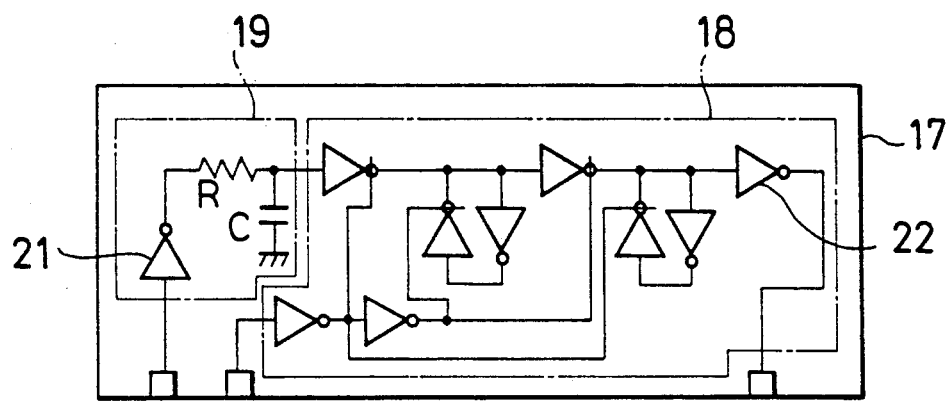

FIG. 13 is a circuit compositional diagram of a standard cell 17 which is another embodiment of the present invention.

In the same diagram, the standard cell 17 comprises a flip-flop circuit 18 and a delay circuit 19. The standard cell 17 has the same logic function as the cell 11 in FIG. 10. However, the total number of inverters used in the cells differ from each other. Namely, the cell 17 has a circuit construction in which two inverters 15 and 20 connected in series in the cell 11 are removed.

Input of the delay circuit 19 is effected with positive logic through an inverter 21, and output of the delay circuit 19 is effected with a negative logic. Input of the flip-flop circuit 18 is effected with negative logic from the delay circuit 19, and output thereof is effected with a positive logic through an inverter 22. As mentioned above, when the delay circuit is provided in the standard cell, the inverters can be removed as long as the delay circuit 19 and the flip-flop circuit 18 are connected in series and in the case in which the delay circuit is built in one cell, when the delay circuit in the cell is not used, the standard cell has completely the same logic function.

Figure 7:
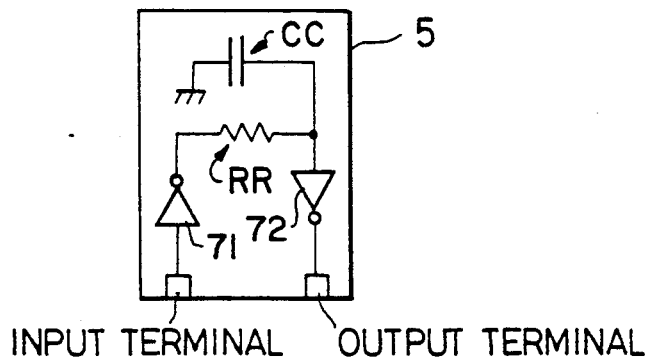
FIG. 7 and 8 are circuit diagrams of a conventional delay standard cell and a flip-flop standard cell respectively.
Figure 8:
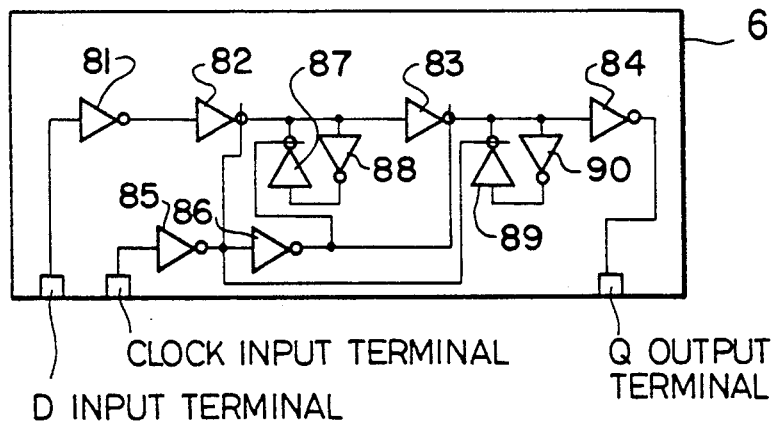

Moreover, the area of the cell 17 becomes smaller than the area of a cell having a flip-flop function, that is, the sum of the area of the cell 6 in FIG. 8 and that of the cell 5 in FIG. 7 (the area of a cell having a delay function). When cell 17 having the so-constructed delay function is employed, the chip area can be reduced as compared with the case of the cell 11 shown in FIG. 10.

Figure 14:
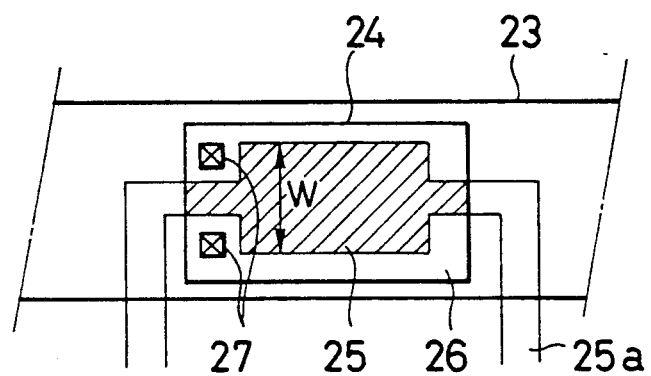
FIG. 14 is a diagram of a delay element built in the standard cell according to another embodiment.

FIG. 14 is a compositional diagram of a delay element built in the standard cell of another embodiment according to the present invention.

The same diagram shows a case in which a delay element, the resistor R and the capacitor C in FIG. 13 are built under power source lines 23.

A first diffusion layer 24, a polysilicon line 25 and a second diffusion layer 26 are also built under the power source lines 23. A portion designated by oblique lines in the diffusion layers 24, 26 and the polysilicon line 25 composes a MOS transistor.

Moreover, the first diffusion layer 24, the polysilicon line 25 and the second diffusion layer 26 respectively correspond to the electrodes of a source, a drain and a gate of the MOS transistor. Reference numeral 27 denotes contact holes to the power source.

Figure 9:
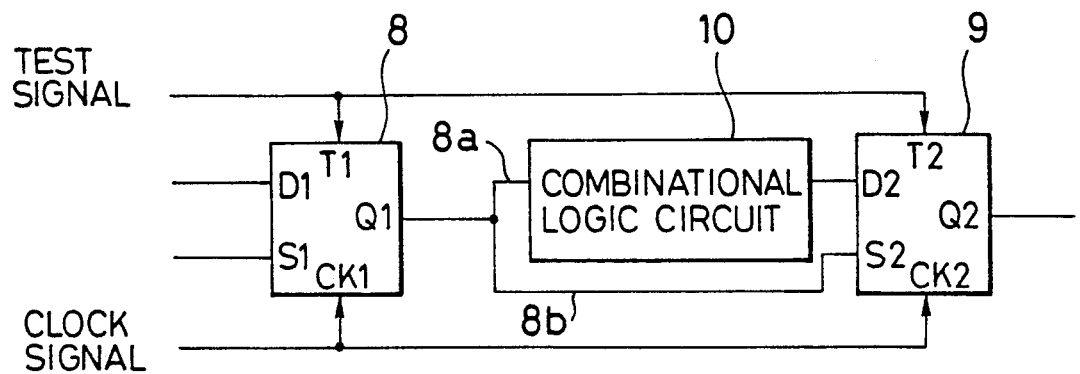
FIG. 9 is a partial diagram of a test-facilitated integrated circuit.

In this embodiment, a gate capacitance of the MOS transistor corresponds to the capacitance of the condenser C in FIG. 13, while, a resistance of the polysilicon 25 corresponds to the resistance of the resistor R in FIG. 9. For example, the gate capacitance can be set at a predetermined value by changing the width W of the gate portion shown in FIG. 14, so that the delay time can be also set at a predetermined value.

Generally, it is seldom that other circuit elements are built under power source lines 23.

By providing the delay circuit in this area, it becomes possible that the cell according to this embodiment and incorporating the delay circuit has the same width and size as a cell not incorporating a delay circuit.

Accordingly, a delay function can be added to a cell without changing the width, the size, the terminal positions and the number of terminals of the cell.

Figure 12:
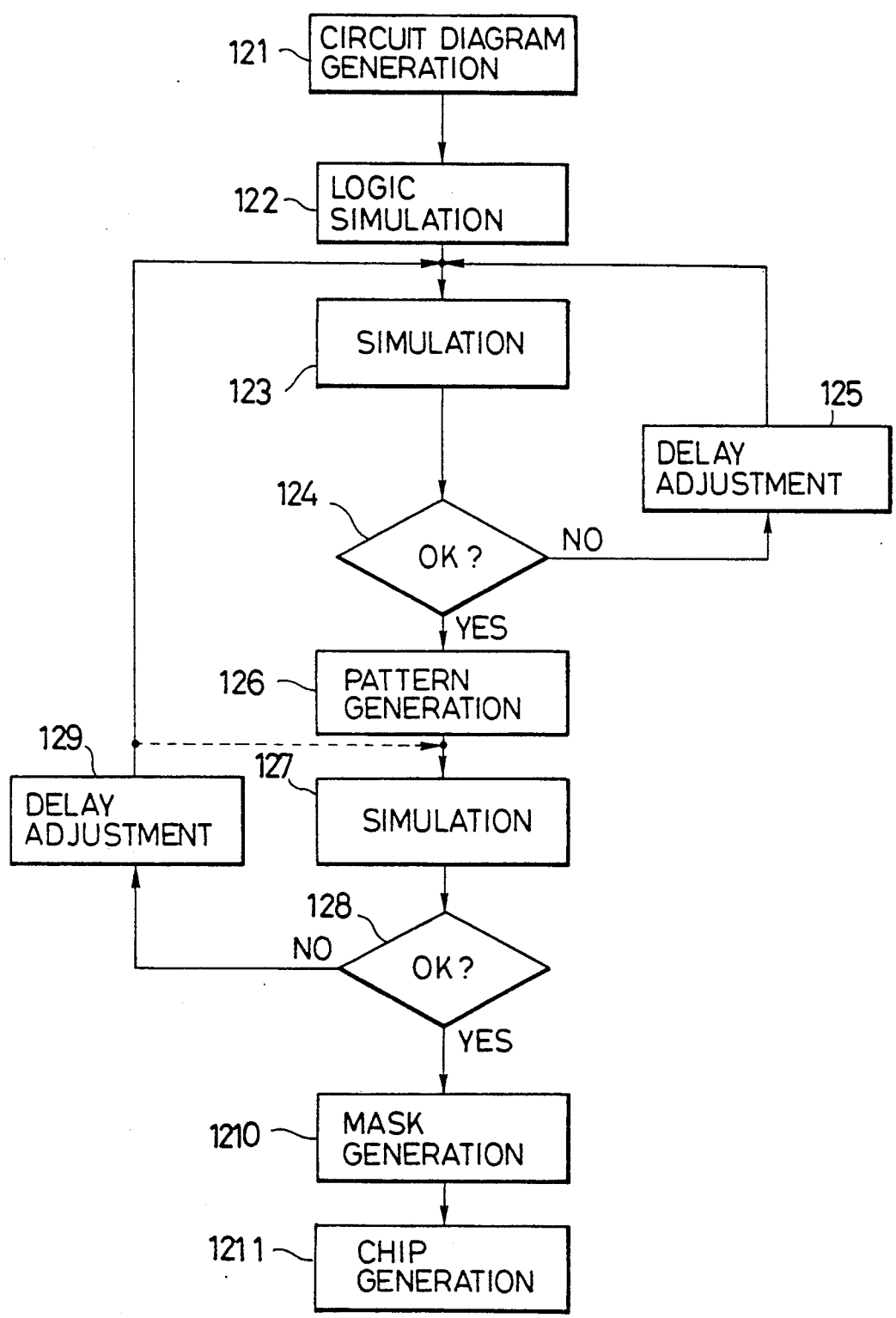
FIG. 12 is a flow chart for designing a standard-cell-type integrated circuit.

Thus, according to the standard cell of the embodiment, it is not necessary to repeat Process 126 in the process diagram of FIG. 12 even though a negative judgment is given at Branch 128. Namely, the cell of the embodiment incorporating the delay function has the same size and terminal positions as the conventional cell, so that only the simulation in Process 127 in FIG. 12 need be repeated for the cell.

It is also possible to determine each location requiring a signal delay by means of an operation test on the obtained real integrated circuit, and replace each standard cell provided at the location with a cell incorporating the delay function according to the present invention without changing the pattern of the other portions.

As a result, the determination of the delay time and the delay adjustment at each location on a circuit can be carried out extremely rationally, and the development term of the standard-cell-type integrated circuit can be remarkably shortened.

In order to replace a cell not incorporating the delay function with the cell of this embodiment incorporating the delay function while effectively utilizing the result of the automatic placement and routing, there may be used a cell incorporating the delay function and having a shape to be expanded in the vertical direction to the cell row to such an extent that each wiring area (channel) between the cell rows is not affected. In this case, the lateral length and the terminal positions of the cell are not changed.

A relatively large transistor wiring area may be assigned in advance to a cell not incorporating the delay function in the pattern generation process, i.e., Process 126 in FIG. 12. Then, when it is judged that the cell should be subjected to delay adjustment by the result of the simulation in Process 127 based on the real wiring length, the cell can be replaced with the cell 11 incorporating the delay function.

In the case where the delay circuit is built in one cell, it is preferable that the increase of the cell area be controlled to as small an increase as possible, and it is more preferable that the process be carried out without the increase. For this purpose, any given free spaces in the cell may be used as an area in which the delay circuit is provided as well as using the construction shown in FIG. 14.

In the composition shown in FIG. 14, the reed portion 25a of the polysilicon gate 25 may be bent in any given shape, thereby changing the resistance and the delay time thereof.

Next, will be described a test-facilitated integrated circuit produced with the standard cell according to the embodiment and incorporating the delay function.

Figure 15:
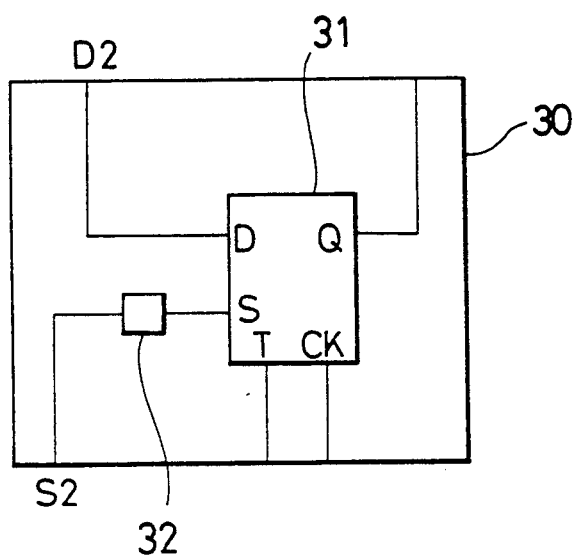
FIGS. 15 and 16 are internal diagrams of standard cells employed in the test-facilitated circuit in FIG. 9.

The test-facilitated standard-cell-type integrated circuit of the embodiment is based on the serial scan method. FIG. 9 is a partial compositional diagram of the test-facilitated standard-cell-type integrated circuit. The diagram has already been described in the description of the prior art. FIG. 15 is an internal compositional diagram of a standard cell 30 which is employed in the test-facilitated standard-cell-type integrated circuit in FIG. 9.

The standard cell 30 of this embodiment has a flip-flop circuit 31 and a signal delay circuit 32 as shown in FIG. 15.

The flip-flop circuit 31 in the standard cell 30 has a data input terminal D, a data output terminal, a clock signal input terminal CK, a scan signal input terminal S and a terminal T for controlling switching of a scan operation mode and an ordinary operation mode all over the integrated circuit.

In the standard cell 30, the delay circuit 32 is disposed between a terminal S2 for inputting a scan signal and the scan signal input terminal S of the flip-flop circuit 31 in the standard cell 30. When a signal delay is made much larger than a delay of a clock signal from CK1 to CK2, the test on the integrated circuit is carried out correctly.

Figure 16:
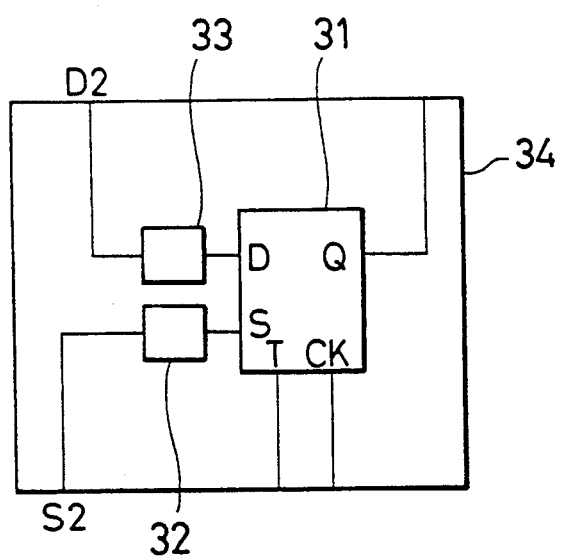

In the composition of FIG. 9, when the delay time of a combinational logic circuit 10 is short, a propagation delay of a clock signal is generated by the clock wiring length between the standard cells 8 and 9, and incorrect operation may be caused. In order to prevent incorrect operation, another delay circuit 33 is disposed between a data input terminal D2 and the data input terminal D of the flip-flop circuit 31 in a standard cell 34 as shown in FIG. 16 to compensate for the clock signal delay.

Otherwise, in order to compensate for the clock signal delay, a delay circuit may be provided between a data output terminal Q1 in the cell 8 (FIG. 9) and a data output terminal (not shown in FIG. 9) of a flip-flop circuit in the cell 8 (FIG. 9).

The present invention is applicable to other methods. For example, it is applicable to a bus method in which a flip-flop is connected a RAM structure.

As mentioned above, according to the standard cell and the standard-cell-type integrated circuit of the present invention, it becomes possible to reduce the number of cells whose arrangement locations are not decided at the time of the pattern preparation by automatic placement and routing. Accordingly, it becomes possible to correctly set the operational timing of a circuit. Moreover, when a standard cell having the delay function and the same lateral length and terminal positions as a cell not having the delay function is employed at the position requiring signal delay compensation, rational delay adjustment can be realized without changing the arrangement pattern which is already prepared. Accordingly, the development term for standard-cell-type integrated circuit can be greatly shortened.

Various modifications will be apparent for those skilled in the art after receiving the teachings of the present disclosure without departing from the scope thereof.

What is claimed is:

1. A process for manufacturing a standard-cell-type circuit, said standard-cell-type circuit including a plurality of standard cells, comprising the steps of:

(a) determining a location for a first standard cell in said standard-cell-type circuit, said first standard cell performing a predetermined function;

(b) evaluating the timing of said standard-cell-type circuit;

(c) adjusting the timing of said standard-cell-type circuit by replacing said first standard cell with a second standard cell such that the geometry of said standard-cell-type circuit is not changed, said second standard cell performing the same predetermined function as the function performed by said first standard cell, said second standard cell having a time delay different from any time delay of said first standard cell, and said second standard cell including an input terminal to input a scan signal for a functional test of said second standard cell and circuitry to delay said scan signal by a predetermined time period; and (d) manufacturing said standard-cell-type circuit, said manufactured standard-cell-type circuit including said second standard cell.

* * * * *